United States Patent [19]
Parekh et al.

[11] Patent Number: 5,945,724
[45] Date of Patent: Aug. 31, 1999

[54] TRENCH ISOLATION REGION FOR SEMICONDUCTOR DEVICE

[75] Inventors: Kunal R. Parekh, Boise; Li Li, Meridian, both of Id.

[73] Assignee: Micron Technology, Inc., Boise, Id.

[21] Appl. No.: 09/058,404

[22] Filed: Apr. 9, 1998

[51] Int. Cl.⁶ .................................................. H01L 29/00
[52] U.S. Cl. .......................................... 257/510; 257/513
[58] Field of Search .................................. 257/506, 510, 257/513; 438/424, 425

[56] References Cited

U.S. PATENT DOCUMENTS

| | | | |
|---|---|---|---|
| 4,839,306 | 6/1989 | Wakamatsu | 438/424 |
| 5,254,218 | 10/1993 | Roberts et al. | 156/662 |
| 5,308,784 | 5/1994 | Kim et al. | 437/67 |
| 5,360,753 | 11/1994 | Park et al. | 437/67 |
| 5,612,242 | 3/1997 | Hsu | 437/56 |
| 5,620,930 | 4/1997 | Hey et al. | 438/421 |
| 5,640,041 | 6/1997 | Lur et al. | 257/510 |
| 5,643,809 | 7/1997 | Lien | 437/31 |
| 5,643,822 | 7/1997 | Furukawa et al. | 437/67 |
| 5,661,049 | 8/1997 | Lur et al. | 438/303 |
| 5,665,632 | 9/1997 | Lur et al. | 438/422 |
| 5,674,775 | 10/1997 | Ho et al. | 438/424 |
| 5,753,561 | 5/1998 | Lee et al. | 438/424 |
| 5,807,789 | 9/1998 | Chen et al. | 438/424 |

*Primary Examiner*—Sara Crane
*Attorney, Agent, or Firm*—Workman, Nydegger & Seeley

[57] ABSTRACT

Shallow trench isolation regions in a semiconductor device are formed by utilizing sacrificial spacers such as polysilicon spacers having a rounded shape to form trench isolation areas. The spacer shape is transferred into a semiconductor substrate during an etching process to define the profile of the trench, resulting in a trench with substantially rounded upper and lower corners in the substrate. An oxide filler material is deposited in the trench and over the substrate to form a covering layer. The covering layer is then polished back to form a filled trench region which electrically isolates active areas in the substrate. The polishing step can be performed by a blanket dry etching procedure, or by a combination of chemical/mechanical planarization and wet etching. The rounded shape of the trench improves the electrical characteristics of the trench such that current leakage is decreased, and also provides a more optimized trench profile for filling the trench with the filler material.

16 Claims, 5 Drawing Sheets

TRENCH ISOLATION REGION FOR SEMICONDUCTOR DEVICE

BACKGROUND OF THE INVENTION

1. The Field of the Invention

The present invention relates to methods for manufacturing semiconductor devices. More particularly, the present invention relates to a method of forming shallow trench isolation regions for a semiconductor device.

2. The Relevant Technology

Electronic devices such as field-effect transistors (FETs) are useful in fabricating integrated circuits such as those used in memory chips and microprocessors. The FETs used in high performance complementary metal oxide semiconductor (CMOS) circuits require advanced isolation techniques for filling recessed field oxide regions. One common isolation technique is known as local oxidation of silicon (LOCOS).

In the LOCOS technique, a thermal oxide liner is formed on a substrate, followed by an island of silicon nitride being formed thereover. The substrate is then placed in an oxidation steam ambient at a high temperature to oxidize the exposed silicon, with the silicon nitride forming a barrier to the steam ambient. The energetic hydrogen and oxygen ions in the steam ambient react with the exposed silicon at high temperature to form a glass which grows by consuming the silicon to form silicon dioxide.

While LOCOS is suitable for certain applications, it has some disadvantages. For example, the LOCOS process is often not suitable for deep submicron dimensions for density driven memory applications because it can result in an undesirable isolation encroachment into the active area of the device. This is commonly referred to in the industry as a "bird's beak." One of the problems of the LOCOS technique is that when a device is scaled down to smaller geometries, it is harder to control the length of the bird's beak, resulting in a very high stress in the silicon leading to stress related defects such as undesirable current leakage.

In other conventional isolation techniques such as shallow trench isolation (STI), islands of nitride are formed and then a trench etch is done to trench the silicon around the islands of nitride. This results typically in a very abrupt-shaped trench. The trenches are subsequently filled with an oxide insulator material, and then polished back and isolated out. While the use of STI leads to many desirable circuit device properties, the technique also possesses some disadvantages. One significant drawback common in STI processes is the presence of "edge conduction," which is excessive current leakage in the upper region between the top of a filled oxide trench and an adjacent silicon mesa. Devices which exhibit high edge conduction are characterized by significant parasitic leakage, which is very undesirable.

A method for forming trench-isolated FET devices to improve subthreshold leakage characteristics is disclosed in U.S. Pat. No. 5,643,822 to Furukawa et al. This method involves forming a vertical slot within a stack structure disposed on an oxide covered silicon substrate, and then forming spacers on the sidewalls of the slot. A trench is then etched in the substrate, followed by removal of the spacers to uncover a horizontal ledge on the exposed surfaces of the substrate adjacent to the trench. The ledge is then perpendicularly implanted with a suitable dopant to suppress edge conduction in the device. This method results in an abrupt-shaped trench with sharp corners which can cause undesirable electrical characteristics in the trench. The sharp corners of the trench can also lead to difficulties in depositing the trench with a filler material during subsequent processing. The sharp corners can lead to pinching off the upper opening to the trench during deposition before the trench is filled, leaving an undesirable void in the trench.

Accordingly, there is a need for an improved semiconductor trench forming method that overcomes or avoids the above problems and difficulties.

SUMMARY OF THE INVENTION

The present invention is directed to a method of forming shallow trench isolation regions having novel trench configurations for a semiconductor device. The method of the invention utilizes sacrificial spacers having a rounded or curved shape to form trench isolation areas. The spacer shape is transferred into a semiconductor substrate to define the profile of the trench. A trench with substantially rounded upper and lower corners is formed in the semiconductor substrate. The rounded shape for the trench improves and enhances the electrical characteristics of the trench, resulting in reduced current leakage. The rounded shape of the trench also provides a more optimized trench profile for filling the trench with a filler material during subsequent fabrication procedures.

In one aspect of the invention, a method of forming a trench isolation region is provided. The method includes providing a silicon substrate with a stack structure formed thereon comprising a layer of oxides of silicon. A vertical slot is formed in the stack structure from a patterned photoresist layer on the stack structure, with the slot having a first width between a pair of slot sidewalls. An overlying spacer layer such as polysilicon is then deposited over the stack structure and vertical slot. The spacer layer is etched to form curved spacers along the sidewalls of the slot. A trench is then etched in the substrate below the slot while simultaneously removing the spacers such that the shape of the spacers is transferred into the trench. The trench has a second width which is less than the first width of the slot. The trench has a pair of upper corners with a substantially rounded profile, such as a convex profile, adjacent to the sidewalls of the slot, and a pair of lower corners with a substantially concave profile.

In further processing steps, an oxide filler material is deposited in the trench and over the stack structure to form a covering layer. The covering layer and stack structure are then planarized so as to form a filled trench region which electrically isolates active areas in the substrate. The planarization can be performed by a blanket dry etching procedure, or by a combination of chemical/mechanical planarization and wet etching.

In another aspect of the invention, a trench isolation structure formed according to the above method is provided in a semiconductor device for electrically isolating active areas in the device. The trench isolation structure includes a semiconductor substrate having an upper surface, and a trench formed in the substrate. The trench is defined by a pair of sidewalls and a bottom wall that is substantially perpendicular to the sidewalls. The trench has a pair of upper corners with a substantially convex profile and a pair of lower corners with a substantially concave profile. The upper corners of the trench join the sidewalls of the trench with the upper surface of the substrate, and the lower corners of the trench join the sidewalls with the bottom wall of the trench. This results in trench configuration having a substantially rounded V-shaped or U-shaped profile. An oxide filler material is disposed in the trench and forms an upper cap structure over the trench which is above the upper surface of the substrate.

Other aspects and features of the present invention will become more fully apparent from the following description and appended claims, or may be learned by the practice of the invention as set forth hereinafter.

BRIEF DESCRIPTION OF THE DRAWINGS

In order to more fully understand the manner in which the above-recited and other advantages and objects of the invention are obtained, a more particular description of the invention briefly described above will be rendered by reference to specific embodiments thereof which are illustrated in the appended drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION OF THE INVENTION

Figure 1A:
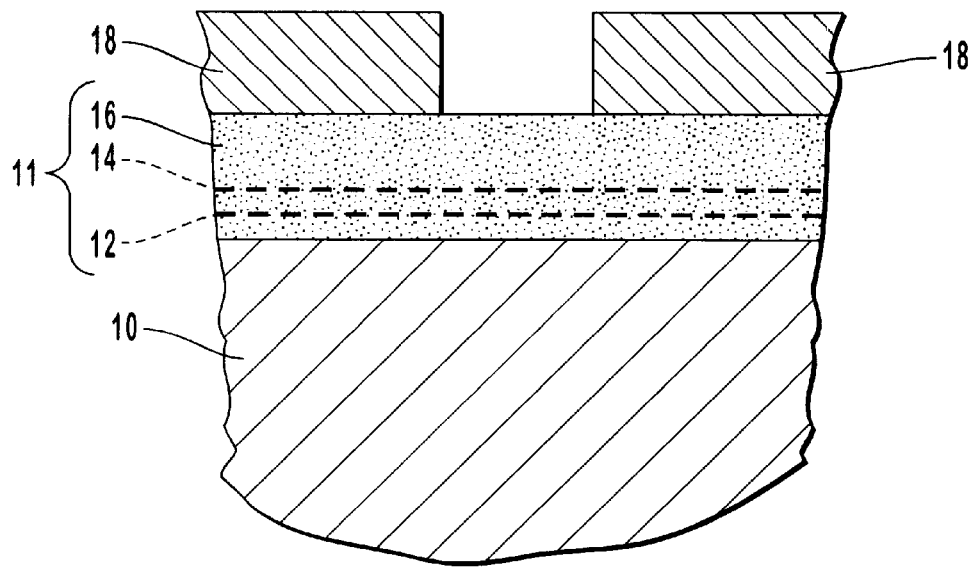
FIGS. 1A–1G are partial cross-sectional views showing successive steps in a method of forming a trench isolation region for a semiconductor device according to the present invention.

The present invention is directed to a method of forming shallow trench isolation regions for a semiconductor device. The method of the invention utilizes sacrificial spacers such as polysilicon spacers having a rounded or curved shape to form trench isolation areas under narrow pitch, with the spacer shape transferred into a semiconductor substrate to define the profile of the trench. Thus, a trench with substantially rounded bottom corners and rounded top corners is formed in the semiconductor substrate, with the trench having a substantially rounded V-shaped or U-shaped profile.

By providing a rounded shape for the trench, the electrical characteristics of the trench are improved and enhanced with respect to current leakage. The rounded profile of the trench avoids the sharp corners of conventional trenches which have high electric fields. Since high electric fields are prevented, the current leakage from a fabricated device is decreased. Further, the rounded corners not only reduce current leakage, but also provide a more optimized trench profile for filling the trench with a filler material during subsequent fabrication procedures. The shape of the trench formed according to the present invention provides ease in filling of the trench, while reducing the critical dimension of the trench width for allowing a filler material of appropriate thickness to be used.

As used herein, the term "semiconductor substrate" is defined to mean any construction comprising semiconductive material, including but not limited to bulk semiconductive material such as a semiconductive wafer, either alone or in assemblies comprising other materials thereon, and semiconductive material layers, either alone or in assemblies comprising other materials. The term "substrate" refers to any supporting structure including but not limited to the semiconductor substrates described above.

Referring to the drawings, wherein like structures are provided with like reference designations, the drawings are partial diagrammatic representations of a semiconductor device such as an integrated circuit structure. Thus, the drawings only show the structures necessary to understand the present invention. Additional structures known in the art have not been included to maintain the clarity of the drawings. FIGS. 1A–1G are partial cross-sectional views showing successive steps in a method of forming a trench isolation region for a semiconductor device according to the present invention. While the drawings depict the formation of a single trench in a substrate, it should be understood that a plurality or multiplicity of such trenches would be typically formed during fabrication of a semiconductor device.

FIG. 1A depicts a semiconductor substrate 10, typically made of silicon or other semiconductor materials. The substrate 10 is covered by a stack structure 11 which may comprise one layer or multiple layers of different materials. For example, substrate 10 can be covered by an optional pad oxide layer 12 (indicated by dashed lines). The pad oxide layer 12 can in turn be covered by an optional nitride layer 14 (indicated by dashed lines) for liner oxidation. An oxide layer 16 is formed over substrate 10 or over optional nitride layer 14 and pad oxide layer 12 when employed.

The pad oxide layer 12 such as a layer of thermal oxide is usually relatively thin when employed, for example in the range of about 50 to about 500 Angstroms, and can be grown by thermal oxidation of substrate 10 or other conventional techniques such as chemical vapor deposition (CVD). The pad oxide layer 12 forms a buffer between nitride layer 14 and the silicon of substrate 10, preventing stress related defects. The optional nitride layer 14 such as silicon nitride typically has a thickness in the range of about 100 to about 6000 Angstroms. Conventional techniques can be used to apply nitride layer 14 such as CVD. The nitride layer 14 helps to protect the pad oxide and the underlying substrate during various processing steps.

The oxide layer 16 can be formed from various oxides of silicon such as silicon dioxide, oxides from a deposition of tetra ethyl orthosilicate (TEOS) or low siliane oxide, and the like. The oxide layer 16 typically has a thickness in the range of about 1000 to about 8000 Angstroms. Conventional techniques can be used to apply oxide layer 16, such as CVD or the decomposition of a precursor such as tetra ethyl orthosilicate (TEOS).

Figure 1B:
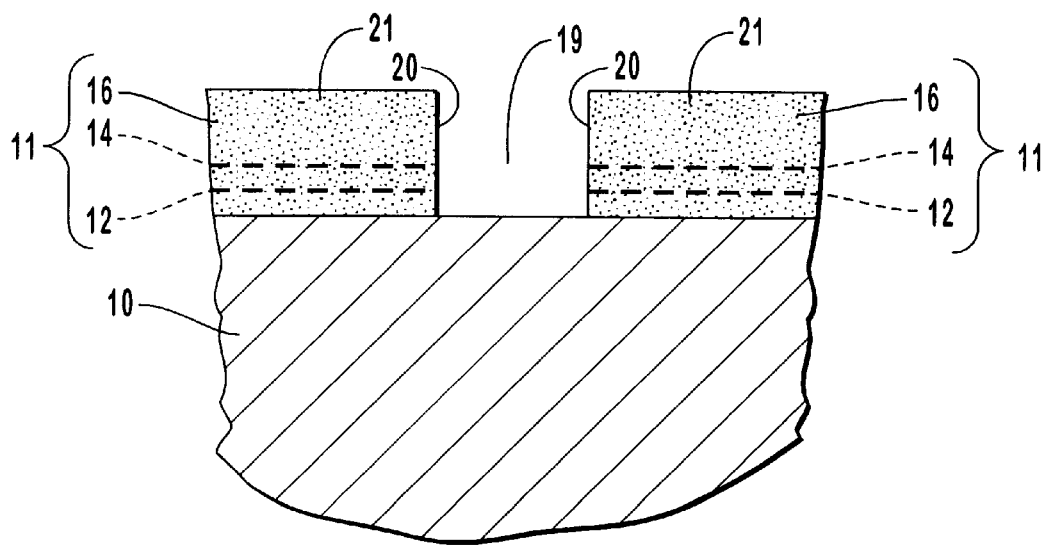

A photoresist layer 18 is formed over oxide layer 16 and patterned to define the dimensions of a slot 19 formed in stack structure 11 as shown in FIG. 1B and discussed in further detail below. Various polymer materials common in semiconductor fabrication may be employed in forming photoresist layer 18, which has a typical thickness in the range from about 1000 to about 8000 Angstroms. The photoresist layer 18 can be applied by conventional techniques such as by a spinning on process.

It should be understood that various other layers or combinations of layers may constitute the stack structure. Selection of the most appropriate layers can be determined by those of ordinary skill in the semiconductor processing art, based on a variety of factors, such as subsequent etching conditions, processing temperature requirements, etch selectivities, and the like.

As depicted in FIG. 1B, a slot 19 defined by a pair of sidewalls 20 is formed in stack structure 11 by conventional techniques. For example, photoresist layer 18 applied over the top surface of stack structure 11 as shown in FIG. 1A is patterned to define the dimensions of slot 19. The defined area is then directionally etched using, for example, reactive ion etching (RIE) techniques. The dimensions of slot 19 will depend on the desired dimension of the trench which will eventually be formed immediately below slot 19. Typically, slot 19 will have a slot width in the range of about 0.1 microns to about 2 microns, although smaller or larger dimensions are possible. The formation of slot 19 in stack structure 11 results in a plurality of islands 21 of stack structure 11. The islands 21 such as oxides of silicon form a pattern where active areas are to be formed.

Figure 1C:
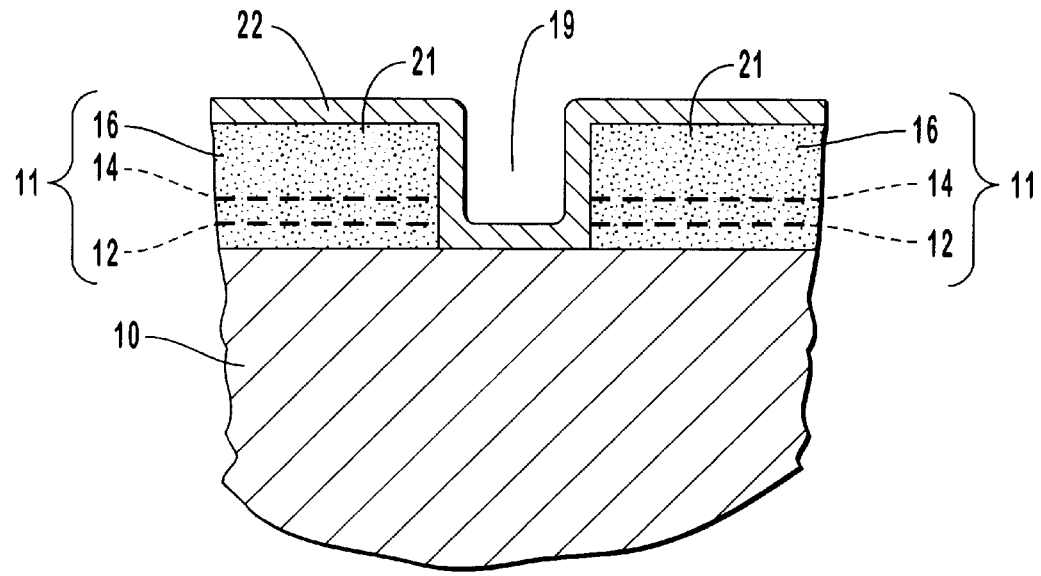

As shown in FIG. 1C, a spacer layer 22 is deposited over substantially all of the exposed surfaces of islands 21 and slot 19. Choice of an appropriate spacer material for spacer layer 22 will depend in part on the materials forming stack structure 11 and their respective etch selectivities. Examples of suitable spacer materials are polysilicon, oxides of silicon or polysilicon which can be doped or undoped, silicon nitride, and polymers such as parylene or photoresist materials.

Figure 1D:
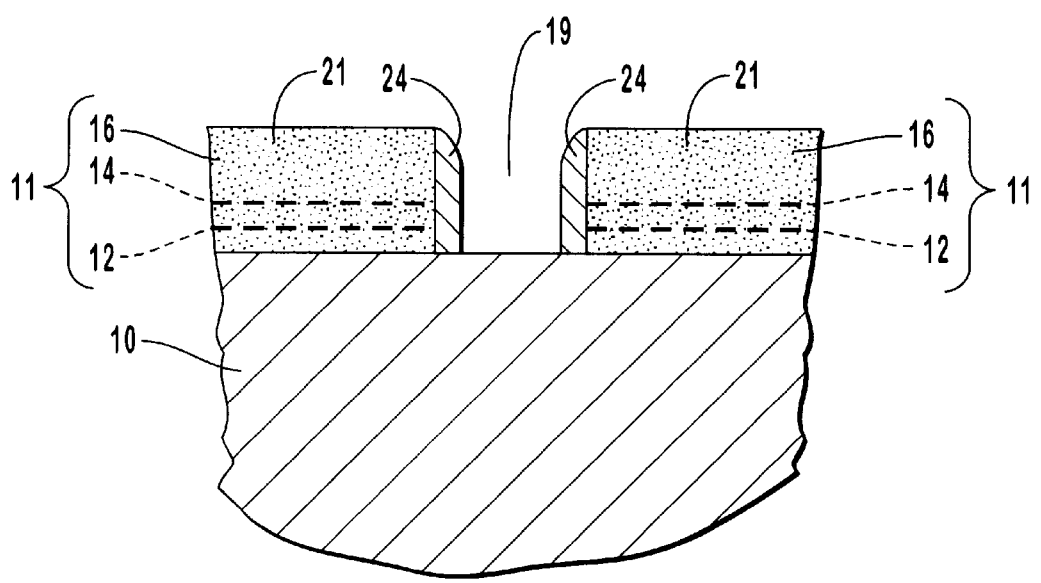

As depicted in FIG. 1D, a spacer etch leaves a pair of spacers 24 having a rounded or curved shape on the sidewalls of slot 19 by etching all horizontally disposed regions of spacer layer 22. Etching of the horizontal regions of spacer layer 22 can be carried out by conventional techniques such as by applying a directed reactive ion beam downwardly onto substrate 10. Such a spacer etch is anisotropic so that material is removed vertically. The anisotropic etching process can be varied by controlling the characteristics of pressure and power to accelerate ions vertically as opposed to at angles. After the spacer etching step, spacers 24 remain along the sidewalls of slot 19, narrowing the width of slot 19.

Preferably, a polysilicon material is used as the spacer material when the substrate is made of silicon so that the spacer shape is translated into the substrate when the trench is formed. For example, a conforming layer of polysilicon can be deposited over the entire upper exposed surface of the structure, and then a spacer etch can be performed to shrink the overlying layer down and leave shoulders forming polysilicon spacers.

Figure 1E:
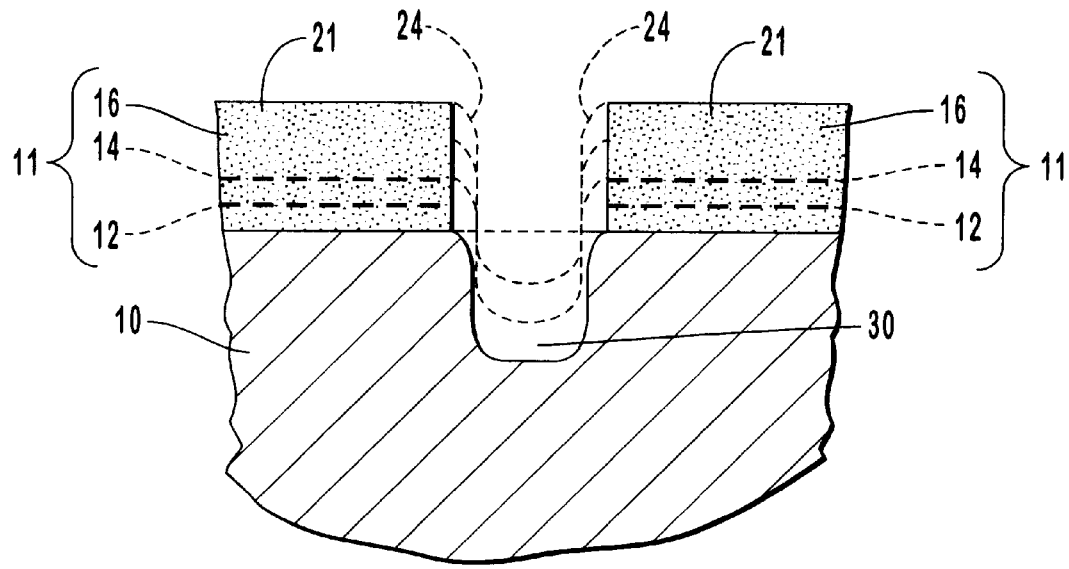
Figure 1F:
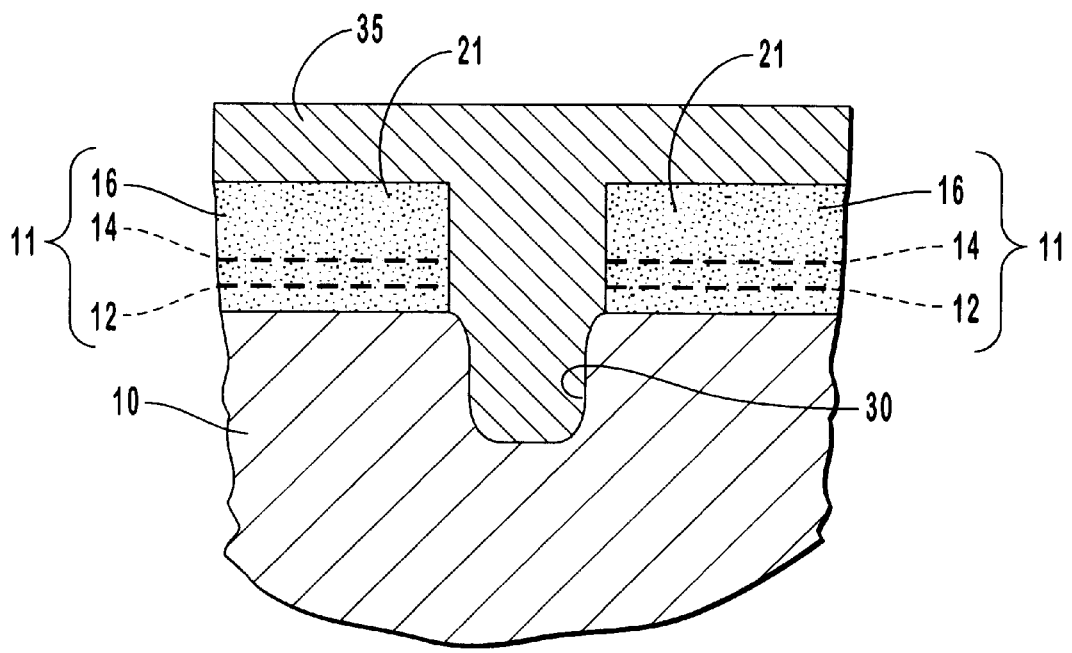

A directed etching process is then used to form a trench 30, as shown in FIG. 1E, which extends into substrate 10. For example, an anisotropic dry etch can be used to etch silicon selective to silicon dioxide to form trench 30 in substrate 10. As depicted in FIG. 1E, spacers 24 are removed simultaneously during the formation of trench 30 such that the shape of spacers 30 is transferred down into substrate 10 forming the sidewalls of trench 30. Accordingly, trench 30 has an essentially rounded V-shaped or U-shaped profile depending on the shape of spacers 24. The depth of trench 30 is typically in the range of about 0.1 micron to about 10 microns. The width of trench 30 is in the range of about 0.1 microns to about 2 microns, and preferably about 0.2 microns to about 0.4 microns. The shape of trench 30 provides for case in filling of trench 30, while reducing the critical dimension of the trench width for allowing a filler material of appropriate thickness to be used.

It should be understood that the step of etching the overlying spacer layer 22 to form spacers 24 and the step of etching spacers 24 to form trench 30 can be done in a continuous process since the same etch can be used in both steps.

Figure 2:
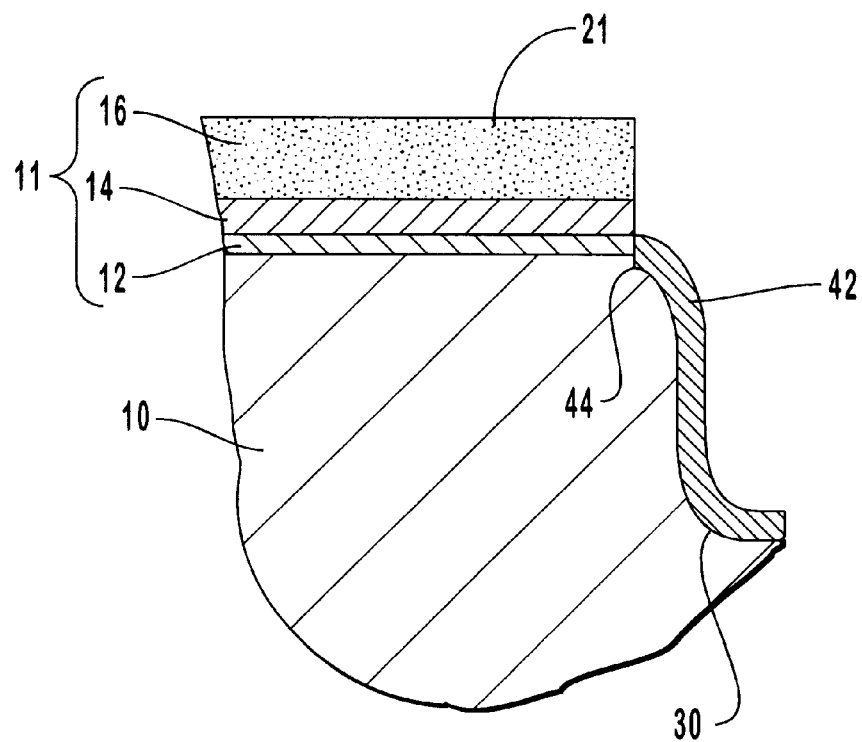
FIG. 2 is a partial cross-sectional view showing an alternative processing step in forming a trench isolation region for a semiconductor device according to the present invention.

At this point, an optional thin oxide liner 42, such as a layer of thermal oxide, can be grown in trench 30. This is shown in FIG. 2, which is an enlarged partial cross-sectional view of the structure of FIG. 1F with trench 30 formed therein. The etching process used to form trench 30 can result in an upper corner 44 of trench 30 which is formed below the plane of the lower boundary of pad oxide layer 12 as depicted in FIG. 2. The oxide liner 42 such as thermal silicon dioxide can be grown to fill in upper corner 44 and to cover the exposed edge of pad oxide layer 12 above trench 30. The oxide liner 42 thereby forms a barrier to the oxidation of silicon exposed by forming trench 30. In addition, oxide liner 42 enhances the structural integrity of the substrate surfaces defining trench 30. The oxide liner 42 can be grown in trench 30 by exposing trench 30 to a high temperature steam ambient. The oxide liner 42 can have a thickness in the range of about 100 to about 200 Angstroms.

Figure 3:
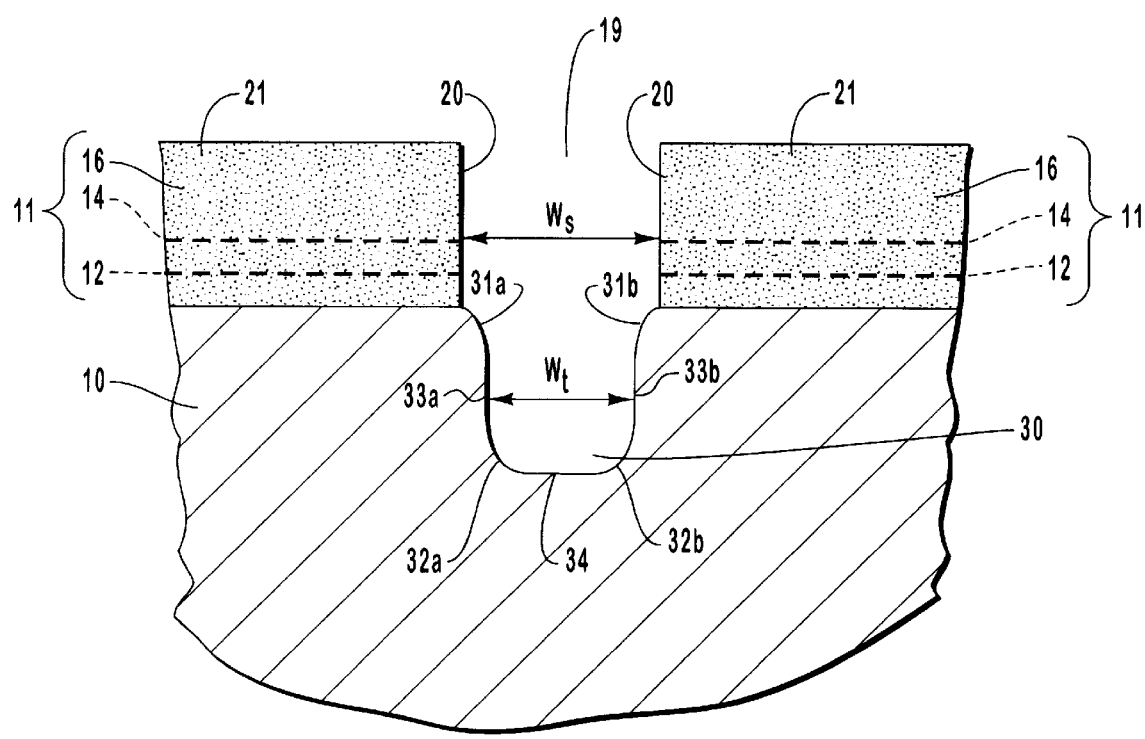
FIG. 3 is a partial cross-sectional view showing a trench formed in a semiconductor substrate according to the present invention.

FIG. 3 is an enlarged cross-sectional view showing trench 30 formed in substrate 10 according to the present invention. The trench 30 includes a pair of upper corners 31a, 31b having a substantially convex profile shape, and a pair of lower corners 32a, 32b having a substantially concave profile shape. A pair of sidewalls 33a, 33b extend between upper corners 31a, 31b and lower corners 32a, 32b. The upper corners 31a, 31b and sidewalls 33a, 33b correspond to the profile of spacers 24 which are removed while forming trench 30. A bottom wall 34, which is substantially perpendicular to sidewalls 33a, 33b, extends between lower corners 32a, 32b. The relationship of these structures in trench 30 provide trench 30 with a substantially V-shaped or U-shaped profile. FIG. 3 also shows that the trench width ($w_t$) of trench 30 is less than the slot width ($w_s$) of slot 19. This occurs since the profile of spacers 24 is transferred into substrate 10 during formation of trench 30.

Figure 1G:
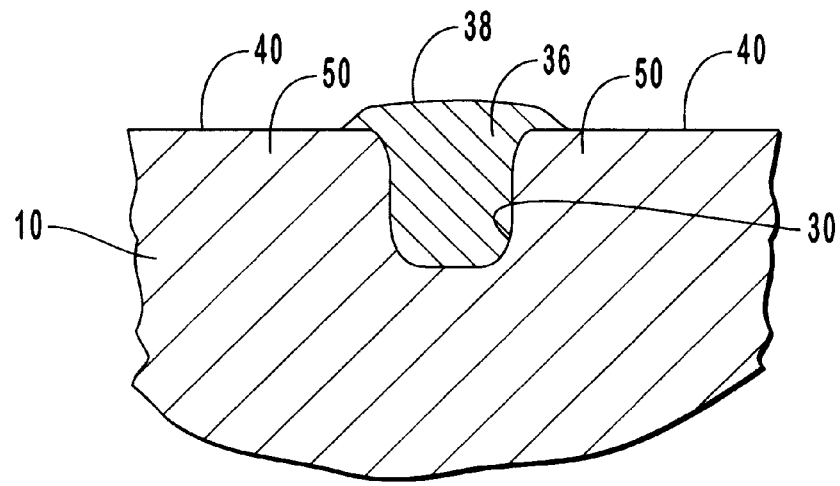

Returning to FIG. 1F, a covering layer 35 of an oxide filler material is deposited over the trenched structure to fill in trench 30 and cover islands 21. The oxide filler material can be formed from a high density plasma (HDP) oxide (e.g., TEOS). A suitable planarization procedure is then performed, leaving a filled trench 36 as shown in FIG. 1G, which electrically isolates a pair of active areas 50 in substrate 10 on either side of filled trench 36. For example, a blanket dry etch selective to silicon can be performed to remove islands 21 and covering layer 35. This leaves filled trench 36 with an upper cap structure 38 at or above the plane of a planar upper surface 40 of substrate 10, which prevents adverse electrical characteristics in the device.

Alternatively, a partial chemical/mechanical planarization (CMP) step can be performed, followed by a wet etch to leave filled trench 36. A wet etch can be employed that etches islands 21 faster than the filled area above trench 30 so as not to recess filled trench 36. This leaves upper cap structure 38 of filled trench 36 above the plane of upper surface 40 of substrate 10 as shown in FIG. 1G. This procedure is preferred when nitride layer 14 is employed in island 21 of stack structure 11. For example, covering layer 35 and islands 21 can be polished back to nitride layer 14 by using CMP. A wet etch such as phosphoric acid is then used to remove nitride layer 14, which does not remove the filled area above trench 30.

Following the planarization procedure, a sacrificial oxide layer (not shown) such as thermal oxide can be grown on upper surface 40 of substrate 10 to expose a new silicon surface if desired. This new oxide layer consumes upper surface 40 of substrate 10 which has been through very high stress and may be damaged. The sacrificial oxide layer is then stripped away to expose the new silicon surface.

Further conventional fabrication techniques can then be carried out to manufacture a desired semiconductor device.

The method of the present invention provides many advantages and benefits. The method of the invention provides a reduced process step technique for isolating electrically active areas of silicon as compared with traditional shallow trench isolation techniques. The resulting trench isolation areas having rounded trench profiles provide improved electrical characteristics in fabricated semiconductor devices. Since the trench shape in a silicon substrate can affect the electrical behavior of the trench, by shaping or rounding the corners of the trench to eliminate sharp corners, high electric fields are prevented, which in turn decreases the current leakage resulting from damaged trench sidewalls or implantation of materials along the sidewalls. The rounded shape of the trench with rounded bottom corners and rounded top corners also provides for ease in filling of the trench while reducing the critical dimension for the trench width. This allows a filler material of appropriate thickness to be used without formation of undesirable voids in the filled trench.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A trench isolation structure formed in a semiconductor device, comprising:
   a semiconductor substrate having an upper surface;
   a plurality of trenches formed in the semiconductor substrate, each said trench:
      being defined by a pair of sidewalls and a bottom wall that is perpendicular to the sidewalls;
      having a pair of upper corners with a convex profile; and
      having the upper corners thereof joining the sidewalls thereof with the upper surface of the semiconductor substrate;
   a plurality of islands, each said island being situated upon the upper surface of the semiconductor substrate between two trenches of said plurality of trenches and comprising:
      a first dielectric layer upon the upper surface of the semiconductor substrate;
      a second dielectric layer having a composition different than the first dielectric layer and being situated upon the first dielectric layer; and
      third dielectric layer having a composition different than and being situated upon the second dielectric layer;
   a fourth dielectric layer having a composition different than the second dielectric layer, having a top planar surface being situated upon said plurality of islands, and filling said plurality of trenches.

2. The trench isolation structure of claim 1, wherein each said trench has a rounded V-shaped or U-shaped profile.

3. The trench isolation structure of claim 1, wherein there is an oxide liner layer formed on the surface of each said trench.

4. The trench isolation structure of claim 1, wherein each of the first, third, and fourth dielectric layers are composed of an oxide of silicon, and the second dielectric layer is composed of a nitride of silicon.

5. A trench isolation structure formed in a semiconductor device, comprising:
   a semiconductor substrate having an upper surface;
   a plurality of trenches formed in the semiconductor substrate, each said trench:
      being defined by a pair of sidewalls and a bottom wall that is perpendicular to the sidewalls;
      having a pair of lower corners with a concave profile; and
      having the lower corners thereof joining the sidewalls with the bottom wall thereof;
   a plurality of islands, each said island being situated upon the upper surface of the semiconductor substrate between two trenches of said plurality of trenches and comprising:
      a first dielectric layer upon the upper surface of the semiconductor substrate;
      a second dielectric layer having a composition different than the first dielectric layer and being situated upon the first dielectric layer; and
      a third dielectric layer having a composition different than and being situated upon the second dielectric layer;
   a fourth dielectric layer having a composition different than the second dielectric layer, having a top planar surface, being situated upon said plurality of islands, and filling said plurality of trenches.

6. The trench isolation structure of claim 5, wherein each said trench has a rounded V-shaped or U-shaped profile.

7. The trench isolation structure of claim 5, wherein there is an oxide liner layer formed on the surface of each said trench.

8. The trench isolation structure of claim 5, wherein each of the first, third and fourth dielectric layers are composed of an oxide of silicon, and the second dielectric layer is composed of a nitride of silicon.

9. A trench isolation structure for electrically isolating active areas in a semiconductor device, comprising:
   a semiconductor substrate having a planar upper surface;
   a plurality of trenches formed in the semiconductor substrate, each said trench:
      being defined by a pair of sidewalls and a bottom wall that is perpendicular to the sidewalls;
      having a pair of upper corners with a convex profile and a pair of lower corners with a concave profile;
      having the upper corners thereof joining the sidewalls thereof with the upper surface of the semiconductor substrate; and
      having the lower corners thereof joining the sidewalls with the bottom wall thereof;
   a plurality of islands, each said island being situated upon the planar upper surface of the semiconductor substrate between two trenches of said plurality of trenches and comprising:
      a first dielectric layer upon the upper surface of the semiconductor substrate;
      a second dielectric layer having a composition different than the first dielectric layer and being situated upon the first dielectric layer; and
      a third dielectric layer having a composition different than and being situated upon the second dielectric layer,
   a fourth dielectric layer having a composition different than the second dielectric layer, having a top planar surface, being situated upon said plurality of islands, and filling said plurality of trenches.

10. The trench isolation structure of claim 9, wherein each said trench has a rounded V-shaped or U-shaped profile.

11. A semiconductor device having trench isolation structures for electrically isolating active areas in the device, comprising:
a semiconductor substrate having a planar upper surface;
a plurality of trenches formed in the semiconductor substrate, the trenches each defined by a pair of sidewalls and a bottom wall that is perpendicular to the sidewalls, the trenches each having a pair of upper corners with a convex profile and a pair of lower corners with a concave profile, the upper corners of each trench joining the sidewalls of the trench with the upper surface of the semiconductor substrate, and the lower corners of each trench joining the sidewalls with the bottom wall of the trench;
a plurality of islands, each said island being situated upon the planar upper surface of the semiconductor substrate between two trenches of said plurality of trenches and comprising:
a first dielectric layer upon the upper surface of the semiconductor substrate;
a second dielectric layer having a composition different than the first dielectric layer and being situated upon the first dielectric layer; and
a third dielectric layer having a composition different than and being situated upon the second dielectric layer;
an oxide filler material disposed in each trench, upon each island, having an upper cap structure with a top planar surface over each said trench, said top planar surface of the oxide filler material being is above the planar upper surface of the semiconductor substrate.

12. An isolation structure comprising:
a semiconductor substrate having a plurality of active areas therein;
a plurality of trenches in the semiconductor substrate, each said trench:
being in between a pair of active areas and defined by a pair of sidewalls and a bottom wall that is perpendicular to the sidewalls;
having a pair of upper corners with a convex profile and a pair of lower corners with a concave profile; and
having an oxide liner on a surface thereof
a plurality of islands, each said island being situated upon a planar upper surface of the semiconductor substrate between two trenches of said plurality of trenches and comprising:
a first dielectric layer upon the planar upper surface of the semiconductor substrate;
a second dielectric layer having a composition different than the first dielectric layer and being situated upon the first dielectric layer; and
a third dielectric layer having a composition different than and being situated upon the second dielectric layer;
a covering layer, composed of an electrically insulative material, filling each said trench, covering each said island, and having a planar top surface, each said trench electrically isolating a respective pair of said active areas.

13. An isolation structure as defined in claim 12, wherein:
each pair of adjacent islands are separated by a first width therebetween;
each said trench has a second width which is less than the first width, each said trench has a pair of upper corners with a rounded profile intersecting the planar upper surface of the semiconductor substrate and adjacent to a respective pair of islands.

14. The isolation structure as defined in claim 12, wherein:
each said first dielectric layer is a pad oxide layer formed over the semiconductor substrate;
each said second dielectric layer is a silicon nitride layer formed over the pad oxide layer; and
each said third dielectric layer is a layer of oxide of silicon formed over the silicon nitride layer.

15. An isolation structure comprising:
a semiconductor substrate;
a plurality of trenches in the semiconductor substrate each having a width, a pair of convex profiled upper corners, and a pair of concave profiled lower corners;
a plurality of islands each being situated between two of said trenches and being separated from a respective adjacent island by a distance that is greater than the width of each said trench, each said island comprising:
a first dielectric layer upon the semiconductor substrate;
a second dielectric layer having a composition different than the first dielectric layer and being situated upon the first dielectric layer; and
a third dielectric layer having a composition different than and being situated upon the second dielectric layer;
an electrically insulative layer filling each said trench, contacting each said island, and having a planar top surface.

16. An isolation structure comprising:
a semiconductor substrate having a planar upper surface and a plurality of active areas therein;
a plurality of trenches in the semiconductor substrate, each said trench:
being in between a respective pair of active areas and defined by a pair of sidewalls with a width therebetween and a bottom wall that is perpendicular to said sidewalls;
having a pair of upper corners with a convex profile and a pair of lower corners with a concave profile; and
having an oxide liner on a surface thereof;
a plurality of islands, each said island being situated upon the planar upper surface of the semiconductor substrate between two respective trenches of said plurality of trenches and being separated from a respective adjacent island by a distance that is greater than the width between the sidewalls of each said trench, each said island comprising:
a first dielectric layer upon the planar upper surface of the semiconductor substrate;
a second dielectric layer having a composition different than the first dielectric layer and being situated upon the first dielectric layer; and
a third dielectric layer having a planar top surface and having a composition different than and being situated upon the second dielectric layer;
a covering layer, composed of an electrically insulative material, filling each said trench, covering each said island, and having a planar top surface, each said trench electrically isolating the respective pair of active areas the trench is between.

* * * * *

UNITED STATES PATENT AND TRADEMARK OFFICE
CERTIFICATE OF CORRECTION

PATENT NO. : 5,945,724
DATED : Aug. 31, 1999
INVENTOR(S) : Kunal R. Parekh; Li Li It is certified that error appears in the above-identified patent and that said Letters Patent is hereby corrected as shown below:

Col. 3, line 57, after "provides" change "case" to --ease--

Col. 5, line 58, after "for" change "case" to --ease--

Signed and Sealed this

Eighteenth Day of July, 2000

Attest:

Q. TODD DICKINSON

*Attesting Officer*     *Director of Patents and Trademarks*